United States Patent

Hoshi et al.

[11] Patent Number: 5,851,283
[45] Date of Patent: Dec. 22, 1998

[54] METHOD AND APPARATUS FOR PRODUCTION OF SINGLE CRYSTAL

[75] Inventors: Ryouji Hoshi; Masashi Sonokawa; Izumi Fusegawa; Tomohiko Ohta, all of Fukushima-ken, Japan

[73] Assignee: Shin-Etsu Handotai Co. Ltd., Tokyo, Japan

[21] Appl. No.: 770,499

[22] Filed: Dec. 20, 1996

[30] Foreign Application Priority Data

Dec. 29, 1995 [JP] Japan ........................ 7-353914

[51] Int. Cl.$^6$ .................................... C30B 15/22
[52] U.S. Cl. ................... 117/32; 117/30; 117/917
[58] Field of Search .................. 117/14, 15, 30, 117/32, 201, 202, 218, 917

[56] References Cited

U.S. PATENT DOCUMENTS

| | | | |
|---|---|---|---|
| 4,849,188 | 7/1989 | Takasu, et al. | 117/217 |
| 5,178,720 | 1/1993 | Frederick | 117/208 |
| 5,196,085 | 3/1993 | Szekely, et al. | 359/415 |
| 5,359,959 | 11/1994 | Fusegawa, et al. | 117/13 |

*Primary Examiner*—Felisa Garrett
*Attorney, Agent, or Firm*—Ronald R. Snider

[57] ABSTRACT

A single crystal production apparatus based on an HMCZ method for production a large-diametered single crystal having a uniform microscopic oxygen concentration distribution in its crystal growth direction to thereby provide a wafer having a high in-plane uniformity of oxygen concentration distribution. In the single crystal production apparatus based on the HMCZ method, when B denotes a vertical position of the bottom surface of a melt within a crucible and L denotes the depth of the melt at the time of starting crystal pulling operation, a vertical position of the coil central axis Cc of superconducting electromagnets 12 and 15 is controlled to be a proper value included in a range from a position below the position B by $\{(1/3) \times L\}$ to a position above the position B by $\{(1/3) \times L\}$ to pull the single crystal. Thereby the intensity of a magnetic field applied to the melt in the vicinity of the interface of the crystal growth within the crucible is weakened to increase the degree of freedom of the convection of the melt, while the intensity of the magnetic field applied to the melt in the vicinity of the bottom part of the crucible is strengthened to suppress the convection.

10 Claims, 4 Drawing Sheets

METHOD AND APPARATUS FOR PRODUCTION OF SINGLE CRYSTAL

The present disclosure relates to subject matter contained in Japanese patent application No.353914 (filed on Dec., 29 1995) which is expressly incorporated herein by reference in its entirety.

BACKGROUND OF THE INVENTION

1. Field of the Invention

The present invention relates to a method and apparatus for production of a single crystal and more particularly, to a horizontal magnetic field applied CZ (Czochralski) method (which will be referred merely as the HMCZ method, hereinafter) for pulling a single crystal from raw material melt within a crucible while applying a horizontal magnetic field from a magnetic field applying device to the melt, and also to an apparatus suitably embodying this HMCZ method.

2. Description of the Related Art

As well known, the above HMCZ method is excellent in various points over a usual CZ method. The apparatus embodying the HMCZ method corresponds to an improvement in the apparatus embodying the usual CZ method, in which magnetic field applying devices each having an electromagnets such as a superconducting magnet are disposed outside a heater for heating a crucible as opposed to the respective field applying devices with the crucible arranged therebetween.

For example, when it is desired to pull a silicon single crystal out of a silicon melt held in a quartz crucible, the employment of the HMCZ method is advantageous in that the thermal convection of the melt is suppressed remarkably to reduce fluctuations with time in the temperature (temperature at the interface between the solid of the pulling single crystal and the melt) in the vicinity of the surface of the melt and the quantity of SiO dissolved into the melt from the crucible is reduced, which results in that generation of dislocation and defects can be suppressed and a homogeneous silicon single crystal having a low oxygen concentration can be easily obtained.

An example of prior art single crystal production apparatuses based on the HMCZ method is disclosed in U.S. Pat. No. 4,565,671. With this apparatus, the central axis of a superconducting coil is arranged to coincide with the surface of a melt contained in a quartz crucible, thereby suppressing convection in the vicinity of the melt surface and causing thermal convection downwards from the vicinity of the melt surface.

Challenges of a single crystal growth technique involved by the recent demand of a larger-diameetered single crystal include reducing the oxygen concentration of the single crystal and improving a productivity based on the stable crystal growth. Particularly in these years, electronic device manufacturing process have been put in a more cleaned or purified environment and correspondingly the necessity of the gettering effect for heavy metal impurities in the bulk of a wafer has been decreased, another demand has been directed to obtaining such a single crystal as to have a lower oxygen concentration.

As the diameter of the single crystal is increased, the diameter of the quartz crucible used becomes larger. This increases the quantity of SiO dissolved into the melt in the crucible from the surface of the crucible to thereby increase the oxygen concentration of the melt. For this reason, a larger-diameetered single crystal having a diameter of 8 inches or more obtained with use of a larger quartz crucible tends to be higher in oxygen concentration than a smaller-diameetered single crystal obtained with use of a smaller quartz crucible.

Factors causing increase of the quantity of SiO dissolved into the melt from the inner surface wall of the quartz crucible with the increased single crystal diameter include increase in frictional force at the inner wall of the crucible caused by a heavier melt during rotation of the crucible, increase in the quantity of heat applied to the crucible caused by the increased crucible opening diameter, and increase in the convection of the melt caused by increase in temperature difference in the melt. Accordingly, in order to reduce the oxygen concentration of the large-diameetered single crystal, it is highly important to suppress the convection of the melt within the crucible.

The single crystal production apparatus disclosed in the aforementioned publication, however, has had a problem that the convection of the melt at the interface of the crystal growth is suppressed so that the ununiform oxygen concentration of the melt reflects directly on the bulk of the crystal, that is, such a crystal grows that has ununiform oxygen concentration distribution in a direction of its crystal growth axis. The above disclosed apparatus has also had another problem that the convection in the vicinity of the surface of the melt of the crucible is suppressed but the thermal convection under the surface vicinity is present, which results in that the convection in the bottom part of the crucible is large as in the prior art and thus the dissolution and corrosion of the quartz crucible excessively advances, disadvantageously shortening the life of the crucible.

SUMMARY OF THE INVENTION

In view of the above problems in the prior art, it is therefore an object of the present invention to provide a single crystal production method and apparatus based on an HMCZ method, which causes easy convection at the surface part of a melt in a crucible and suppression of convection in the bottom part of the crucible to thereby enhance the uniformity of an oxygen concentration distribution in a crystal growth axis direction, in particular, the uniformity of a microscopic oxygen concentration distribution measurable by a microscope applied Fourier-transformation infrared spectroscopy (micro FT-IR method) and also to stably manufacture a large-diameetered single crystal having less defect and a low oxygen concentration.

Another object of the present invention is to prolong the life of a quartz crucible, to decrease the number of used quartz crucibles necessary per pulling single crystal, and to decrease a time necessary for replacement of the crucible.

In accordance with an aspect of the present invention, the above objects can be attained by providing a single crystal production method for pulling a single crystal from a raw material melt contained in a crucible based on a horizontal magnetic field applied CZ method, in which the crucible is provided within a pulling chamber, a heater surrounds the crucible, coils comprising electromagnets in magnetic field applying device are disposed outside the pulling chamber as coaxially opposed to each other with the crucible disposed therebetween, so that the single crystal is pulled while a horizontal magnetic field is applied to the melt of the crucible; wherein, when B denotes a vertical position of a bottom surface of the melt within the crucible and L denotes the depth of the melt at the time of starting the crystal pulling operation, a vertical position of a coil central axis of the electromagnets at the time of starting the crystal pulling operation is controlled to be a proper value included in a range of from $\{B-(1/3) \times L\}$ to $\{B+(1/3) \times L\}$. As a result, the present invention is featured in that the intensity of the magnetic field applied to the melt in the vicinity of the interface of the crystal growth within the crucible is weakened to increase the degree of freedom of the melt convection and, at the same time, the intensity of the magnetic field applied to the melt in the vicinity of the bottom part of the crucible is strengthened to suppress the convection.

In the single crystal production method of the present invention, as will be clear from results of test example to be explained later, it is most preferable that the vertical position of the coil central axis of the electromagnets at the time of starting the crystal pulling operation be made to coincide with the vertical position B of the bottom surface of the crucible melt. When a silicon single crystal is pulled, it is preferable that the intensity of a magnetic field applied to the melt in the vicinity of an interface of crystal growth is controlled to be within a range of 100 gauss to 4000 gauss, whereas an intensity of a magnetic field applied to the melt in the vicinity of a bottom part of the crucible is controlled to be within a range of 500 gauss to 8000 gauss.

It is also desirable that a horizontal distance between the electromagnets and the crucible is kept constant during the crystal pulling operation.

In the single crystal production method of the present invention, when a crystal pulling method is employed wherein the depth of the melt within the crucible decreases with passage of a crystal pulling time, the crucible is continuously moved upwardly during the crystal pulling operation to compensate for a decrease in height of the surface position of the melt. Meanwhile, when the elevation of the crucible position may undesirably cause reduction of the intensity of the magnetic field at the bottom part of the crucible, the electromagnets are moved to suitably adjust a magnetic field intensity distribution. When the adjustment of the magnetic field intensity distribution due to the movement of the electromagnets is not carried out, the intensity of the magnetic field in the vicinity of the bottom part of the crucible becomes weak and the effect of suppressing the melt convection becomes correspondingly weak, with the result of the remarkable deterioration of the crucible. This remarkable crucible deterioration occurs when the intensity of the magnetic field is 500 gauss or less, for which reason it becomes necessary to adjust the magnetic field intensity distribution by moving the electromagnets. Further, when a crystal pulling method is employed wherein the depth of the melt within the crucible during the crystal pulling operation has substantially a constant level that is the same as the depth at the time of starting the pulling operation, a vertical position of the crucible and electromagnets is kept constant.

The single crystal production apparatus of the present invention is not limited only to the case where one single crystal rod is pulled from a crucible by a usual CZ method but applicable also to a case where a crystal pulling operation is carried out by a so-called multiple CZ (RCCZ (recharge CZ) method) or a continuous-charging pulling CZ method (CCCZ method).

In the RCCZ method, recharging raw material is carried out without solidifying a melt within a crucible remaining after completion of pulling one single crystal to repeat pulling operation, whereby a plurality of single crystals can be pulled from the same crucible on a batch basis. In the CCCZ method, melt-like raw material or granual polycrystalline raw material is continuously charged into the crucible to continuously pull each single crystal while keeping constant the quantity of melt within the crucible.

When the crystal pulling method is employed wherein the depth of the melt within the crucible decreases with passage of a crystal pulling time, for the purpose of preventing deterioration of the crucible caused by the reduction of the magnetic field intensity, it is valid to stop the crystal pulling operation before the intensity of the magnetic field reaches 500 gauss or less, and to increase the melt by the RCCZ method to perform the crystal pulling operation again.

In order to carry out the present invention by using the RCCZ method, it is only required to add the aforementioned horizontal-field applying device to the prior art pulling apparatus based on the RCCZ method. In order to carry out the present invention by using the CCCZ method, it is only required to add the aforementioned horizontal-field applying device to the prior art pulling apparatus based on the CCCZ method.

In accordance with another aspect of the present invention, there is provided a single crystal production apparatus for pulling a single crystal from a raw material melt contained in a crucible based on a horizontal magnetic field applied CZ method, in which the crucible is provided within a pulling chamber, a heater surrounds the crucible, coils comprising electromagnets in magnetic field applying device are disposed outside the pulling chamber as coaxially opposed to each other with the crucible disposed therebetween, so that the single crystal is pulled while a horizontal magnetic field is applied to the melt of the crucible; wherein, when B denotes a vertical position of a bottom surface of the melt within the crucible and L denotes the depth of the melt at the time of starting the crystal pulling operation, a vertical position of a coil central axis of the electromagnets at the time of starting the crystal pulling operation is controlled to be a proper value included in a range of from $\{B-(1/3) \times L\}$ to $\{B+(1/3) \times L\}$.

In the single crystal production apparatus of the present invention, it is preferable that a device for moving up or down the electromagnets and a device for moving up or down the crucible be provided so that, at the time of pulling the single crystal while moving up the crucible, the electromagnets are moved to suitably adjust a magnetic field intensity distribution, thus preventing reduction of the intensity of the magnetic field at the bottom part of the crucible caused by the elevated movement of the crucible.

It is also preferable that the electromagnets having the same intensity distribution of magnetic fields generated thereby are provided symmetrically with respect to a central axis of the crucible so that an intensity of the magnetic field at an intersection point of a coil central axis of the electromagnets and the central axis of the crucible has a suitable value included in a range of 500 gauss to 6000 gauss.

It is further desirable that the electromagnets be of a type which can increase or decrease the intensity of the magnetic fields generated thereby.

BRIEF DESCRIPTION OF THE DRAWINGS

The above and other objects, features and advantages of the present invention will become apparent from the following detailed description when taken with the accompanying drawings in which.

DESCRIPTION OF THE PREFERRED EMBODIMENTS

An embodiment of the present invention will be detailed with reference to FIG. 1. In a single crystal production apparatus of FIG. 1 based on an HMCZ method, a pair of superconducting electromagnets 12 and 15 having the same specifications are arranged outside a pulling chamber 1 to be symmetrical with respect to an central axis Ac of a crucible 2, so that the electromagnets can be moved up or down by a hoisting and lowering mechanism (not shown), and the crucible 2 is also moved up or down by another hoisting and lowering mechanism (not shown).

With this single crystal production apparatus, assuming that B denotes a vertical position of the lower surface (bottom surface) of a melt within the crucible and L denotes the depth of the melt at the time of starting crystal pulling operation, then a suitable vertical position of the coil central axis of the electromagnets at the time of starting the crystal pulling operation is controlled to be within a range of $\{B-(1/3))\times L\}$ to $\{B+(1/3)\times L\}$. Therefore, the intensity of a magnetic field applied to the melt in the vicinity of the interface of the crystal growth within the crucible is weakened to enhance the degree of freedom of convection immediately under a crystal growth interface M (refer to FIG. 1), whereas the intensity of a magnetic field applied to the melt in the vicinity of the bottom part of the crucible is strengthened to suppress the convection.

When the intensity of the magnetic field applied to the melt is made low in the vicinity of the melt surface while the intensity of the magnetic field in the vicinity of the bottom surface is made high; impurities in the melt, in particular, ununiformity of the oxygen concentration can be corrected to keep uniform a microscopic oxygen concentration distribution within the growing crystal.

According to such a single crystal pulling method, since the effective viscosity coefficient of melt in the the crucible is increased in the lower part of the crucible into which mainly oxygen dissolves whereas the convection of the melt is effectively suppressed in the bottom part of the crucible; it becomes difficult for the melt to dissolve and corrode the crucible and thus the life of the crucible can be prolonged. Further, when a horizontal distance between the electromagnets and crucible is kept constant, variations with time in the intensity distribution of the magnetic field applied to the melt can be made small, thus further enhancing the convection suppressing effect of the melt within the crucible.

The embodiment of the present invention will be explained by referring to the accompanying drawings.

Figure 1:
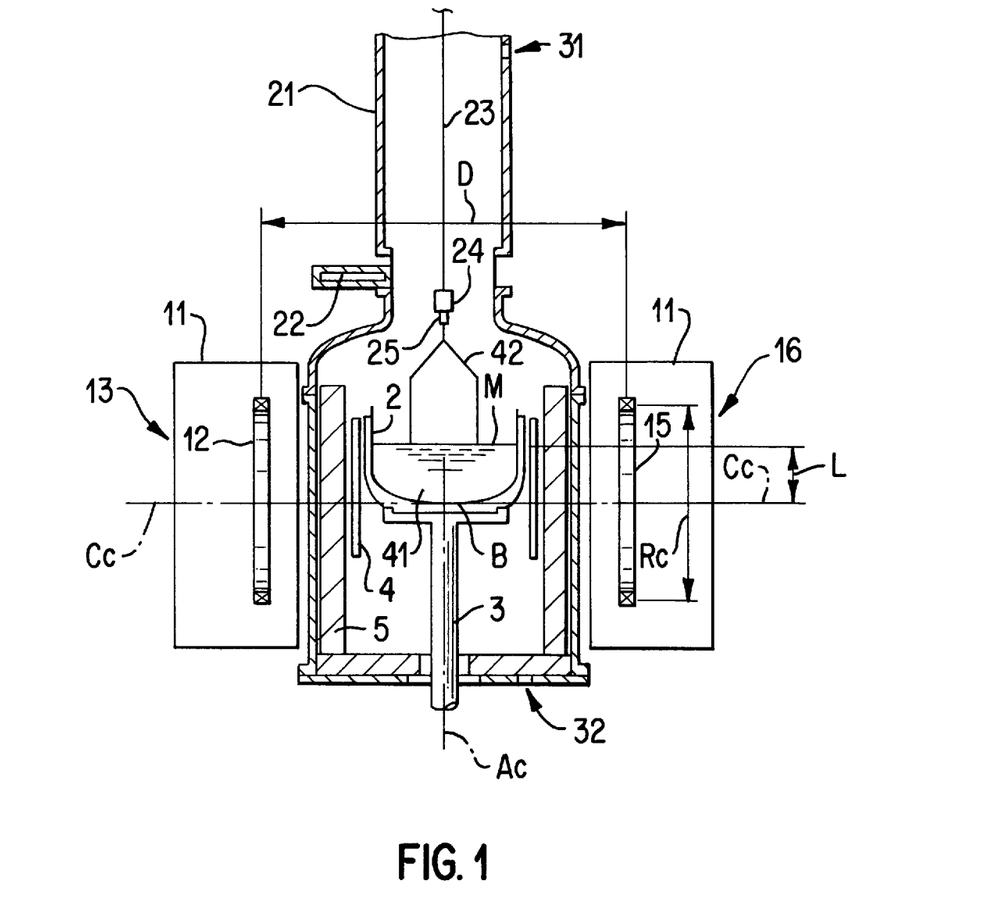
FIG. 1 is a schematic vertical cross-sectional view of a structure of a major part of a single crystal production apparatus in accordance with an embodiment of the present invention, in which a vertical position of the coil central axis of electromagnets is set coinside with the bottom face of a melt in a crucible.

Embodiment 1:

FIG. 1 schematically shows a vertical cross-sectional view of a structure of a major part of an apparatus for pulling a large-diametered silicon single crystal by an HMCZ method.

In the crystal pulling apparatus, the crucible 2 made of quartz in its inner peripheral side wall and made of graphite in its outer peripheral side wall is supported by a vertically-extended supporting shaft 3 within the cylindrical pulling chamber 1 made of stainless steel. Arranged around the crucible 2 is a cylindrical heater 4 made of carbon material around which a heat insurating cylinder 5 made of carbon material. The heater 4 and heat insulating cylinder 5 are mounted to be fixed vertically and horizontally.

The supporting shaft 3 (thus the crucible 2) is provided to permit rotation by a rotationally driving mechanism (not shown) and to permit fine adjustment in its rotational speed. The supporting shaft 3 is provided further to permit moving up or down by a not shown slide mechanism (corresponding to the aforementioned hoisting and lowering mechanism) having a control device and also to permit fine adjustment in its vertical position.

Provided outside the pulling chamber 1 symmetrically with respect to the central axis Ac of the crucible 2 are a magnetic field applying device 13 having an insulating container 11 and a superconducting electromagnet 12 accommodated in the container 11 as well as another magnetic field applying device 16 having the insulating container 11 and another superconducting electromagnet 15 accommodated in the container 11. These magnetic field applying devices, which are fixed in their position, are provided to permit moving up or down by the not shown slide mechanism (corresponding to the aforementioned hoisting and lowering mechanism) having the control device and to permit fine adjustment in their vertical position. The superconducting electromagnets 12 and 15 can generate the same magnetic field intensity distribution and can set the intensity of a magnetic field at an intersection point A between the coil central axis Cc of these electromagnets and the central axis Ac of the crucible at a proper value within a range of 500 gauss to 6000 gauss (most preferably in a range of 2000 gauss to 4000 gauss).

Provided in an upper side of the pulling chamber 1 is a cylindrical pull chamber 21 made of stainless steel to be connected to the pulling chamber 1 concentrically thereto. Disposed at a connection between the pulling chamber 1 and pull chamber 21 is an isolation valve 22. The pull chamber 21 defined therein a space in which a pulled single crystal is accommodated and then discharged therefrom.

Provided above the pull chamber 21 is a device (not shown) for winding up the silicon single crystal which can rotate the single crystal about its vertical axis. Suspended from the crystal winding device is a wire 23 which is attached at its lower end with a seed crystal 25 by means of a seed holding jig 24. Provided in the upper part of the pull chamber 21 is a supply port 31 through which such an inert gas as Ar is supplied into the chamber; whereas, provided in the bottom part of the pulling chamber 1 is an exhaust port 32 through which the inert gas is discharged from the chamber. The exhaust port 32 communicates with a vacuum generator (not shown) in such a manner that the air within the pulling chamber 1 and pull chamber 21 is kept at a predetermined vacuum level. Reference numeral 41 denotes a silicon melt and numeral 42 denotes a silicon single crystal 42.

When it is desired to pull a silicon single crystal, the superconducting electromagnets 12 and 15 are activated and at the same time, the side wall of the crucible 2 is started to be heated by the heater 4. Subsequently, the seed crystal 25 attached to the seed holding jig 24 is brought into contact with the surface of the melt 41, such an inert gas as Ar is supplied onto the surface of the melt 41, the crucible 2 is rotated, and the seed crystal 25 is pulled while being rotated to thereby grow crystal's neck, cone, shoulder and straight body parts sequentially.

In this case, at the time of starting the crystal pulling operation, a vertical position of the coil central axis Cc of the electromagnets is set to be within a range of $\pm(\frac{1}{3}) \times L$ from the vertical position B of the lower surface of the melt 41 in the crucible. In the illustrated embodiment, since the depth of the melt in the crucible becomes shallow with the passage of the crystal pulling time, the crucible 2 is correspondingly continuously moved up. For the purpose of avoiding any excess reduction in the magnetic field intensity at the bottom of the crucible caused by the crucible being moved up, an RCCZ method is employed.

With such an arrangement as mentioned above, during the entire operation ranging from the start of the crystal pulling operation to the end thereof, a vertical position of the coil central axis Cc of the electromagnets is made to coincide with the vertical position B of the bottom surface of the melt 41, so that the intensity of the magnetic field applied to the melt in the vicinity of the crystal growth interface M is controlled to be within the range of 100 gauss to 4000 gauss and most preferably within the range of 500 gauss to 3500 gauss, the intensity of the magnetic field applied to the melt in the vicinity of the bottom part of the crucible is controlled to be within the range of 500 gauss to 8000 gauss and most preferably within the range of 3500 gauss to 6000 gauss. As a result, the intensity of the magnetic field applied to the melt in the vicinity of the interface of the crystal growth within the crucible is set to be weak to enhance the degree of freedom of the melt convection; whereas, the intensity of the magnetic field applied to the melt in the vicinity of the bottom part of the crucible is set to be strong to suppress the convection.

When it is desired to pull a compound semiconductor single crystal in place of the silicon single crystal, it in is necessary to set the specifications (esp. heat generation amount) of the heater, the intensity distribution of the magnetic field generated by the electromagnets and so on; taking the magnitude of viscosity of the raw material melt, i.e., the tendency of easy convection of the melt into consideration. Further, such electromagnets as to be able to increase or decrease the intensity of the magnetic field generated thereby are provided as the above electromagnets to control the intensity of the magnetic field applied to the melt depending on the depth of the crucible melt, whereby the degree of freedom of the melt in the vicinity of the interface of the crystal growth within the crucible can be optimized and the convection of the melt in the vicinity of the bottom part of the crucible can be suppressed to a preferred state.

(Test Examples 1 to 5)

In these tests, the apparatus of FIG. 1 was used to pull silicon single crystals in such a manner as mentioned above based on the RCCZ method. Explanation will next be made as to these tests. In the single crystal pulling method, the depth of a melt within a crucible decreases with time.

(1) Specifications of the pulling apparatus (which are the same in the test examples 1 to 5)

1. Inner diameter of the crucible 2 (melt accommodating part): 600 mm
2. Depth of the crucible 2 (melt accommodating part): 400 mm
3. Outer diameter of the heater 4: 750 mm
4. Coil diameter Rc of the superconducting electromagnets 12 and 15: 840 mm
5. Coil-to-coil distance D of the superconducting electromagnets 12 and 15: 1500 mm (2) Pulling conditions (which conditions 1 to 6 are the same in the test examples 1 to 5)

1. Diameter×length of straight body part of target silicon single crystal: 8 inch (approx. 200 mm)×900 mm
2. Rotational speed of the crucible 2: 0.5 rpm
3. Rotational speed of seed crystal: 16 rpm (constant and inverse in rotational direction of the crucible)
4. Depth of the melt 41 within the crucible 2 at the time of starting pulling operation: L=260 mm
5. Intensity distribution of magnetic field (magnetic-field equi-intensity distribution) at points on the central axis Ac of the crucible 2 is as follows.
   (i) The same vertical position on the coil central axis: 3000 gauss
   (ii) Position 40 mm above the coil central axis: 3300 gauss
   (iii) Position 70 mm above the coil central axis: 3500 gauss
   (iv) Position 100 mm above the coil central axis: 3800 gauss
   (v) Position 130 mm above the coil central axis: 4000 gauss The magnetic field intensity distribution on the lower side of the coil central axis Cc is symmetrical with respect to the magnetic field intensity distribution on the upper side of the coil central axis Cc about the coil central axis Cc.

6. Others: The pressure within the pulling chamber 1 is kept at a vacuum level of 100 mbar while supplying a proper amount of inert gas (Ar).
7. Vertical position of the coil central axis Cc at the time of starting the pulling operation (different among the test examples 1 to 5)

Test example 1: The Cc vertical position is made to coincide with the vertical position B on the bottom surface of the melt 41.

Test example 2: The Cc vertical position is made to coincide with a position 40 mm {40=L/(6.5)} above the position B. That is, the coil central axis Cc is made to coincide with B+{L/(6.5)}.

Test example 3: The Cc vertical position is made to coincide with a position 70 mm {70=L/(3.7)} above the position B. That is, the coil central axis Cc is made to coincide with B+{L/(3.7)}.

Test example 4: The Cc vertical position is made to coincide with a position 100 mm {100=L/(2.6)} above the position B. That is, the coil central axis Cc is made to coincide with B+{L/(2.6)}.

Test example 5: The Cc vertical position is made to coincide with a position 130 mm {130=(L/2)} above the position B. That is, the coil central axis Cc is made to coincide with B+{L/2}.

The conditions of the test examples 1 to 3 are included in the scope of the present invention, while the conditions of the test examples 4 and 5 are not included therein.

Figure 2A:
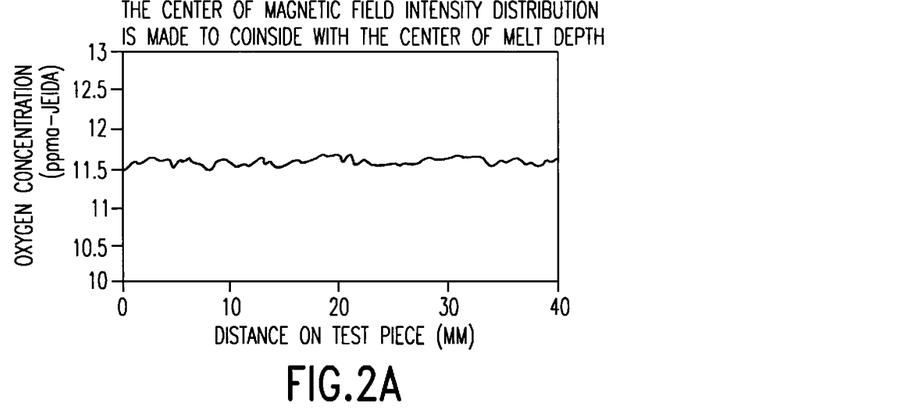
FIG. 2a–2c shows graphs showing microscopic oxygen concentration distributions in a crystal growth direction of silicon single crystal test pieces obtained as results of test examples 1, 3 and 5.
Figure 2B:
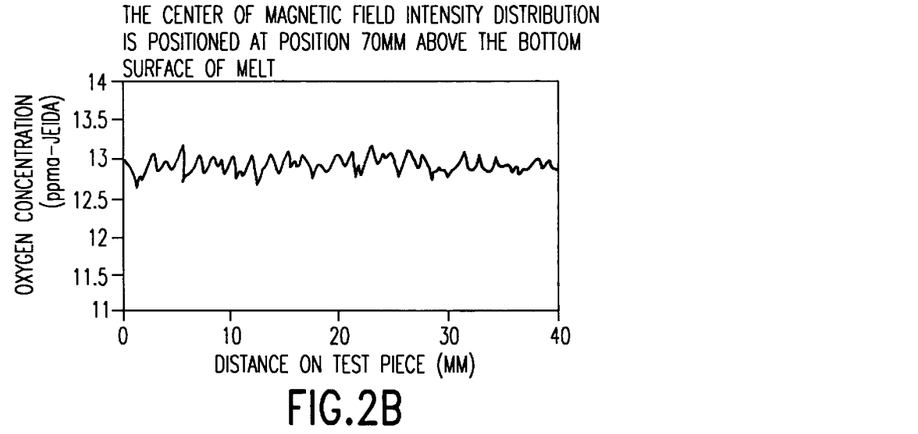
Figure 2C:
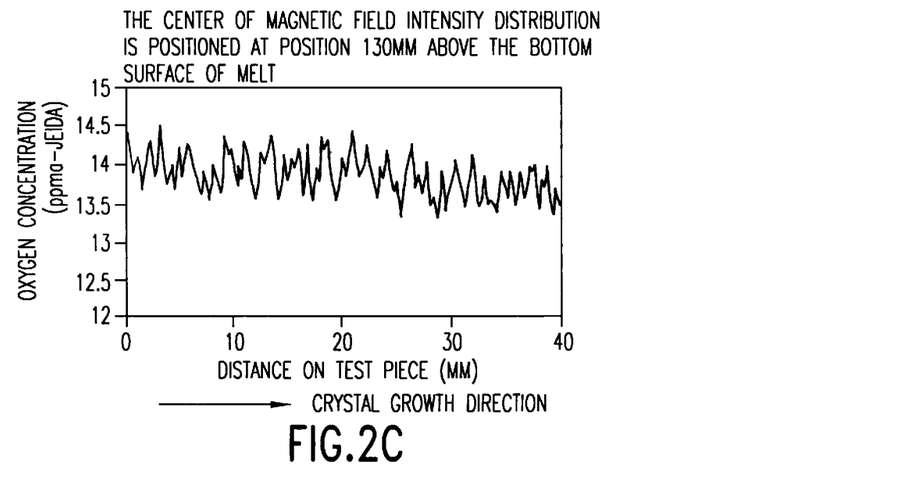

FIG. 2 shows microscopic oxygen concentration distributions in the crystal growth direction of crystals obtained in the test examples 1, 3 and 5. The microscopic oxygen concentration distributions were obtained by measuring the crystals in steps of 250 $\mu$m in their crystal growth direction with use of a beam size of 100 $\mu$m×200 $\mu$m by the micro FT-IR method. In FIG. 2, (*a*) to (*c*) abscissa "Distance On Test Piece" corresponds to a distance of the grown single crystal in the growth direction. Test pieces were vertically cut in the 10–14-cm from the beginning of straight body part of the crystal with a thickness of 2 mm and a width of 20 mm from the central part with the crystal axis. As will be clear from FIG. 2, when the position on the coil central axis Cc corresponds to the position B of the lowest surface of the crucible melt, the uniformity of the oxygen concentration becomes the highest, and as the Cc position is shifted upwards from the position B, the ununiformity of the oxygen concentration increases.

Figure 3:
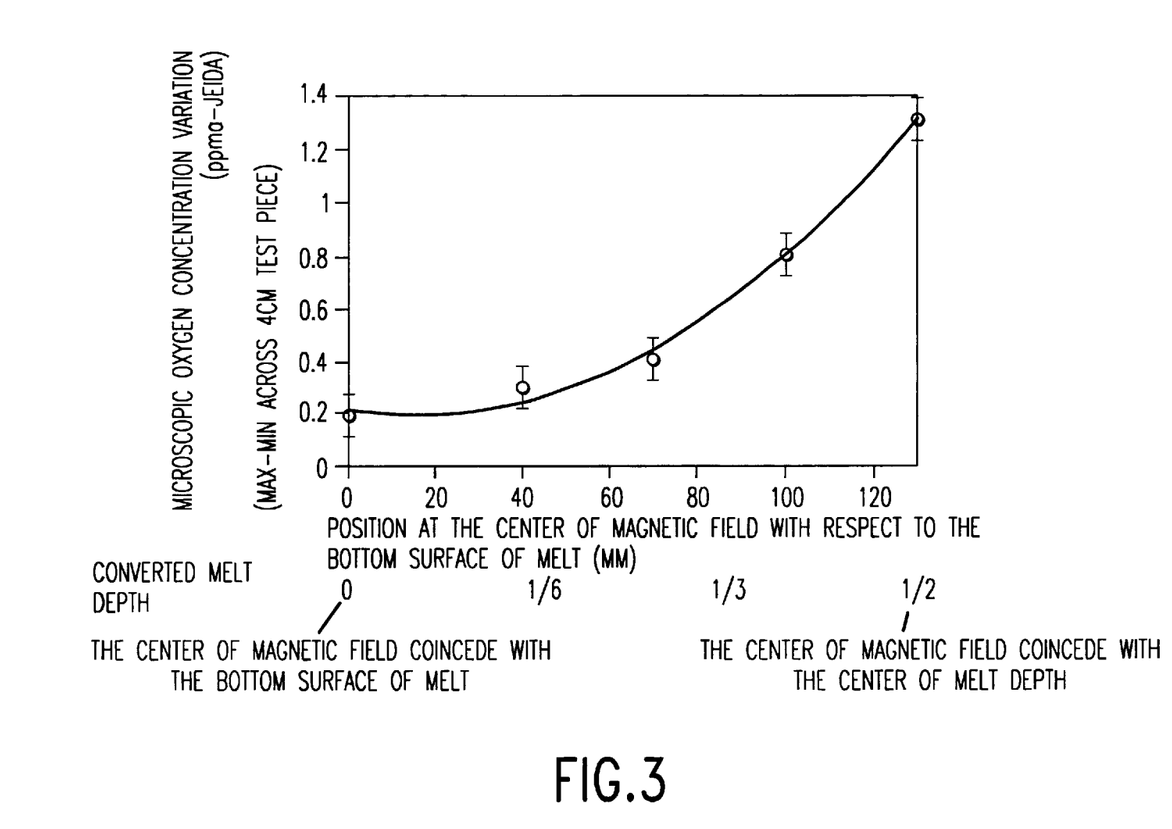
FIG. 3 is a graph showing a relationship between a vertical position (central position of magnetic field) of the coil central axis of the electromagnets and a difference between the highest and lowest oxygen concentration in a microscopic oxygen concentration distribution, as results obtained from micro oxygen concentration distributions of silicon single crystal test pieces obtained in test examples 1 to 5 in their crystal growth direction.

FIG. 3 shows a relationship between a position of the coil central axis Cc (position of the magnetic field center) and a variation in the microscopic oxygen concentration ( in units of ppma-JEIDA). In this connection, the above variation corresponds to a difference between the maximum and minimum in the part of a distance 4 cm in the single crystal growth direction of the test piece.

It will be seen from the drawing that the variation increases as the position on the coil central axis Cc is shifted upwards from the position B of the lowest surface of the crucible melt, and that the variation becomes considerably great when the position of the coil central axis Cc is $\{B+(\frac{1}{2})\times L\}$, that is, when the magnetic flux in the highest magnetic field strength passes through the melt in the vicinity of the interface of the crystal growth.

It will be appreciated from the results of FIGS. 2 and 3 that the position in the melt, at which the position of the center of the magnetic field is set, exercises a great effect on the uniformity of the oxygen concentration.

Since the oxygen concentration distribution of the pulled single crystal in the growth direction reflects directly on wafers prepared from the single crystal, it is desirable to minimize the variation of the oxygen concentration. More specifically, a difference between the maximum and minimum of the part of a distance 4 cm in the single crystal growth direction of the above test piece is preferably less than 1.0 ppma (JEIDA) and more preferably less than 0.6 ppma (JEIDA).

It will be understood from the result of FIG. 3 that, when the melt within the crucible has a depth L at the time of starting the pulling step and when the single crystal pulling operation is started from the position of the coil central axis Cc not exceeding $\{B+(\frac{1}{3})\times L\}$, the variation of the micro oxygen concentration can be controlled to 0.6 ppma (JEIDA) or less.

When the position of the coil central axis Cc is shifted to a position below the position B, the intensity of the magnetic field applied to the melt in the vicinity of the interface of the crystal growth within the crucible becomes weak, thus making small the variation of the microscopic oxygen concentration. However, when the pulling operation is started with the position of the coil central axis Cc set at a position below a position $\{B-(\frac{1}{3})\times L\}$, the intensity of the magnetic field applied to the bottom part of the crucible becomes 3500 gauss or less. This is because the lowest position of the coil central axis Ac was limited to the position $\{B-(\frac{1}{3})\times L\}$ in the present invention.

(Comparative Example 1)

Figure 4:
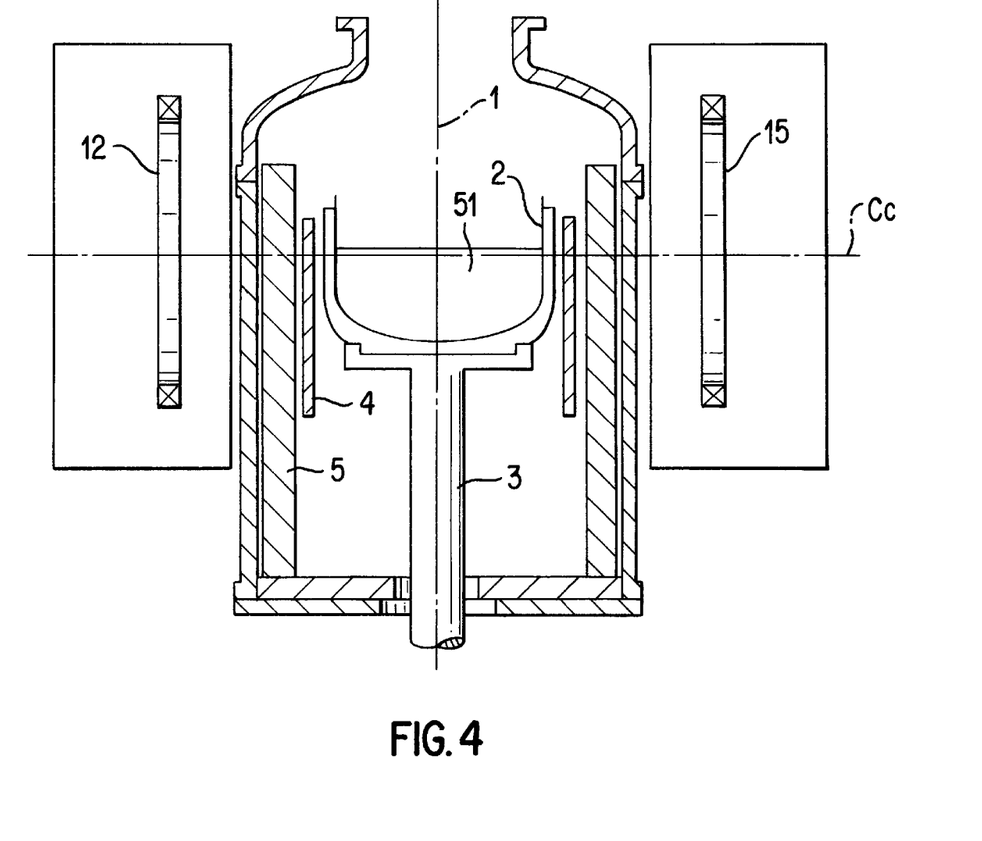
FIG. 4 is a diagram of a comparative example 1 when a vertical position of the coil central axis of electromagnets is set coinside with a line immediately under the surface of a melt in a crucible.

The apparatus of FIG. 1 was used. This example was conducted in the same manner as the test example 1, except that the coil central axis Cc of the superconducting electromagnets 12 and 15 was positioned directly under the upper surface of the silicon melt 51 and directly close to the upper surface of the melt in all steps of pulling a silicon single crystal as shown in FIG. 4, whereby a single crystal having the same size as in the test example 1 was pulled, cut into silicon wafers, and then the wafers were subjected to measurements of their oxygen concentration in the same manner as in the test example 1.

The silicon single crystal of 8 inches in diameter obtained in the comparative example 1 had an oxygen concentration of about 15 ppma (JEIDA), and a 4 cm test piece had a microscopic oxygen concentration variation of about 1.5 ppma (JEIDA).

As has been explained in the foregoing, the single crystal production method and apparatus based on the HMCZ method in accordance with the present invention are arranged so that, assuming that B denotes a vertical position of the bottom surface of the crucible melt and L denotes the depth of the melt at the time of starting the crystal pulling operation, a vertical position of the coil central axis of the electromagnets is controlled to be a proper value included in the range of $\{B-(\frac{1}{3})\times L\}$ to $\{B+(\frac{1}{3})\times L\}$, whereby the intensity of the magnetic field applied to the melt in the vicinity of the interface of the crystal growth is weakened to increase the degree of freedom of the melt convection, while the intensity of the magnetic field applied to the melt in the vicinity of the bottom part of the crucible is strengthened to suppress the convection. Therefore, the present invention can advantageously pull a single crystal having a small microscopic variation in its oxygen concentration. Further, since the convection of the melt in the bottom part of the crucible where mainly oxygen dissolves into the melt is effectively suppressed, there can be stably fabricated a large-diametered single crystal which has a low oxygen concentration and less defect. Furthermore, since it becomes difficult for the melt to corrode the crucible, the life of the crucible can be prolonged and the number of crucibles required per pulling single crystal quantity can be reduced.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the following

What is claimed is:

1. A single crystal production method for pulling a single crystal from a raw material melt contained in a crucible based on a horizontal magnetic field applied CZ method, in which the crucible is provided within a pulling chamber, a heater surrounds the crucible, coils comprising electromagnets in magnetic field applying device are disposed outside the pulling chamber as coaxially opposed to each other with the crucible disposed therebetween, so that the single crystal is pulled while a horizontal magnetic field is applied to the melt within the crucible; wherein, when B denotes a vertical position of a bottom surface of the melt within the crucible and L denotes the depth of the melt at the time of starting the crystal pulling operation, a vertical position of a coil central axis of the electromagnets at the time of starting the crystal pulling operation is controlled to be a proper value included in a range of from $\{B-(\frac{1}{3})\times L\}$ to $\{B+(\frac{1}{3})\times L\}$.

2. A single crystal production method as set forth in claim 1, wherein the vertical position of the coil central axis of the electromagnets at the time of starting the crystal pulling operation is made to coincide with the position B of the bottom surface of the crucible melt.

3. A single crystal production method as set forth in claim 1, wherein, when a silicon single crystal is pulled, an intensity of a magnetic field applied to the melt in the vicinity of an interface of crystal growth is controlled to be within a range of 100 gauss to 4000 gauss, whereas an intensity of a magnetic field applied to the melt in the vicinity of a bottom part of the crucible is controlled to be within a range of 500 gauses to 8000 gauses.

4. A single crystal production method as set forth in claim 1, wherein a horizontal distance between the electromagnets and the crucible is kept constant during the crystal pulling operation.

5. A single crystal production method as set forth in claim 1, wherein, when a crystal pulling method is employed wherein the depth of the melt within the crucible decreases with passage of a crystal pulling time, the electromagnets are moved to suitably adjust a magnetic field intensity distribution.

6. A single crystal production method as set forth in claim 1, wherein, when a crystal pulling method is employed wherein the depth of the melt within the crucible during the crystal pulling operation has substantially a constant level that is the same as the depth at the time of starting the pulling operation, a vertical position of the crucible and the electromagnets is kept constant.

7. A single crystal production apparatus for pulling a single crystal from a raw material melt contained in a crucible based on a horizontal magnetic field applied CZ method, in which the crucible is provided within a pulling chamber, a heater surrounds the crucible, coils comprising electromagnets in magnetic field applying device are disposed outside the pulling chamber as coaxially opposed to each other with the crucible disposed therebetween, so that the single crystal is pulled while a horizontal magnetic field is applied to the melt within the crucible; wherein, when B denotes a vertical position on a bottom surface of the melt within the crucible and L denotes the depth of the melt at the time of starting the crystal pulling operation, the apparatus is so constructed that a vertical position of a coil central axis of the electromagnets at the time of starting the crystal pulling operation is able to controlled to be a proper value included in a range of from $\{B-(\frac{1}{3})\times L\}$ to $\{B+(\frac{1}{3})\times L\}$.

8. A single crystal production apparatus as set forth in claim 7, wherein means for moving up or down the electromagnets and means for moving up or down the crucible are provided so that, at the time of pulling the single crystal while moving up the crucible, the electromagnets are moved to suitably adjust a magnetic field intensity distribution.

9. A single crystal production apparatus as set forth in claim 7, wherein the electromagnets having the same intensity distribution of magnetic fields generated thereby are provided symmetrically with respect to a central axis of the crucible so that an intensity of the magnetic field at an intersection point of a coil central axis of the electromagnets and the central axis of the crucible has a suitable value included in a range of 500 gauss to 6000 gauss.

10. A single crystal production apparatus as set forth in claim 9, wherein the electromagnets increase or decrease the intensity of the magnetic fields generated thereby.

* * * * *